United States Patent [19]
Kimura et al.

[11] Patent Number: 5,954,994
[45] Date of Patent: Sep. 21, 1999

[54] PIEZOELECTRIC CERAMIC COMPOSITION

[75] Inventors: Masahiko Kimura; Tadahiro Minamikawa; Akira Ando, all of Shiga-ken, Japan

[73] Assignee: Murata Manufacturing Co., Ltd., Japan

[21] Appl. No.: 09/028,893

[22] Filed: Feb. 24, 1998

[30] Foreign Application Priority Data

Apr. 28, 1997 [JP] Japan .................................... 9-110546

[51] Int. Cl.$^6$ .................................................. H01L 41/18
[52] U.S. Cl. ...................................... 252/62.9 R; 501/134; 501/135
[58] Field of Search ....................... 252/62.9 R; 501/134, 501/135

[56] References Cited

U.S. PATENT DOCUMENTS

| | | | |
|---|---|---|---|
| 4,248,727 | 2/1981 | Kawashima et al. | 501/137 |
| 5,763,346 | 6/1998 | Minamikawa et al. | 501/135 |

OTHER PUBLICATIONS

Kimura et al, "Temperature Characteristics of (Ba1–xSrx)NaNb5O15 Ceramics", Jpn. J. Appl. Phys., vol. 36 (9b) part 1, 6051–54. Sep. 1997.

"Ferroelectric Properties of Tungsten Bronze Morphotropic Phase Boundary Systems"; J.R. Oliver: J. Am. Ceram. Soc., vol. 72, No. 2, 1989, pp. 202–211, XP002072803. no month.

JP 09 165 262 A (Matsushita Denki Sangyo KK); Jun. 24, 1997 Abstract, Derwent Publications Ltd.

JP 55 075 965 A (Matsushita Elec. Indus. Co. Ltd.); Jun. 7, 1980 Abstract, Derwent Publications Ltd.

*Primary Examiner*—C. Melissa Koslow
*Attorney, Agent, or Firm*—Gstrolenk, Faber, Gerb & Soffen, LLP

[57] ABSTRACT

Improved are the piezoelectric characteristics of conventional ceramics of $(Ba_{1-x}Sr_x)_2NaNb_5O_{15}$ where $0 \leq x \leq 1$, and provided is a novel piezoelectric ceramic composition which does not contain lead and which can be practiced industrially as a material for piezoelectric ceramic devices such as piezoelectric ceramic filters, etc. The piezoelectric ceramic composition comprises, as the essential component, a ceramic component of the general formula, $(1-y)(Ba_{1-x}Sr_x)Nb_2O_6 - yNaNbO_3$ where $0 \leq x \leq 1$ and $0.15 \leq y < 1/3$. Preferably, the composition contains, as the side component, at least one oxides of Mn, Cr, W, Si, Mo, Ni, Co, Sn, Mg, Sb, Ti, Zr and Fe, in a total amount of not larger than about 5% by weight in terms of $MnO_2$, $Cr_2O_3$, $WO_3$, $SiO_2$, $MoO_3$, $NiO$, $Co_2O_3$, $SnO_2$, $MgO$, $Sb_2O_3$, $TiO_2$, $ZrO_2$ and $Fe_2O_3$, respectively.

18 Claims, No Drawings

PIEZOELECTRIC CERAMIC COMPOSITION

FIELD OF THE INVENTION

The present invention relates to a piezoelectric ceramic composition, particularly to a piezoelectric ceramic composition which is usable in the field of electronic parts as a material for piezoelectric ceramic devices such as piezoelectric ceramic filters, piezoelectric ceramic oscillators, etc.

BACKGROUND OF THE INVENTION

Piezoelectric ceramic compositions consisting essentially of lead titanate zirconate or lead titanate are widely used in piezoelectric ceramic devices such as piezoelectric ceramic filters, etc.

Known as piezoelectric materials are compounds containing Ba, Sr, Na, Nb, O and the like. For example, $Ba_2NaNb_5O_{15}$, $Sr_2NaNb_5O_{15}$ and the like are known as materials having piezoelectric characteristics and electro-optical effects, and single crystals of those compounds have been being widely studied. However, few studies have been made on the use of those compounds. In 1989, J. R. Oliver et al. (J. Am. Ceram. Soc., 72 [2] 202–11 (1989)) reported the ferroelectricity of ceramics of $(Ba_{1-x}Sr_x)_2NaNb_5O_{15}$ ($0 \leq x \leq 1$), but they did not refer in detail to the piezoelectric characteristics of those ceramics.

Conventional piezoelectric ceramic compositions consisting essentially of lead titanate zirconate or lead titanate, which have heretofore been used widely, contain lead, and are therefore not so favorable from the viewpoint of environmental protection. To produce the conventional compositions, generally used are lead oxides. The lead oxides used easily vaporize, resulting in that it is relatively difficult to control the quality of the products produced.

On the other hand, ceramics of $(Ba_{1-x}Sr_x)_2NaNb_5O_{15}$ ($0 \leq x \leq 1$) do not contain lead and are therefore free from the problems mentioned above. However, those ceramics are inferior to the piezoelectric ceramic compositions consisting essentially of lead titanate zirconate or lead titanate in point of their piezoelectric characteristics as indicated by, for example, the electromechanical coupling factor and the piezoelectric constant, and therefore they have not been practiced industrially as materials for piezoelectric ceramic devices such as piezoelectric ceramic filters, piezoelectric ceramic oscillators, etc.

Given that situation, the object of the present invention is to improve the piezoelectric characteristics of those $(Ba_{1-x}Sr_x)_2NaNb_5O_{15}$ ($0 \leq x \leq 1$) ceramics and to provide a novel piezoelectric ceramic composition which does not contain lead and which can be used industrially as a material for piezoelectric ceramic devices such as piezoelectric ceramic filters, piezoelectric ceramic oscillators, etc.

SUMMARY OF THE INVENTION

In order to solve the technical problems mentioned hereinabove, the present invention provides a piezoelectric ceramic composition comprising, as the essential component, a ceramic component represented by a general formula $(1-y)(Ba_{1-x}Sr_x)Nb_2O_6 - yNaNbO_3$ where $0 \leq x \leq 1$ and $0.15 \leq y < \frac{1}{3}$. Preferably, x is about 0.25–0.75 and y is about 0.2–0.3.

In the formula, $0.15 \leq y < \frac{1}{3}$. This is because when $y<0.15$, polarizable piezoelectric ceramics could not be obtained. If $y \geq \frac{1}{3}$, the composition does not have satisfactory piezoelectric characteristics.

Preferably, the piezoelectric ceramic composition contains, as a side component, at least one oxide of Mn, Cr, W, Si, Mo, Ni, Co, Sn, Mg, Sb, Ti, Zr and Fe, in a total amount of not larger than about 5% by weight in terms of $MnO_2$, $Cr_2O_3$, $WO_3$, $SiO_2$, $MoO_3$, NiO, $Co_2O_3$, $SnO_2$, MgO, $Sb_2O_3$, $TiO_2$, $ZrO_2$ and $Fe_2O_3$, respectively.

The side component, if added to the composition, is effective in further improving the piezoelectric characteristics of the composition. The total amount of the side component in the composition is defined to be not larger than about 5% by weight. This is because if it is larger than about 5% by weight, polarizable piezoelectric ceramics are difficult to obtain.

In another aspect of the invention, there is provided a piezoelectric ceramic composition comprising, as the essential component, a ceramic component represented by a general formula $(Ba_{1-x}Sr_x)_2NaNb_5O_{15}$ where $0 \leq x \leq 1$, and containing, as a side component, an oxide of Mn in an amount of not larger than about 5% by weight in terms of $MnO_2$.

The amount of the Mn oxide is defined to be not larger than about 5% by weight for the same reason as above, that is, if the amount of the Mn oxide in the composition is larger than about 5% by weight, polarizable piezoelectric ceramics are difficult to obtain.

DESCRIPTION OF PREFERRED EMBODIMENTS OF THE INVENTION

Now, some preferred embodiments of the invention are described below, which, however, are not intended to restrict the scope of the invention.

EXAMPLE 1

First prepared were starting materials of $BaCO_3$, $SrCO_3$, $Na_2CO_3$, $Nb_2O_5$ and $MnCO_3$.

Next, these materials were weighed to give a component of $(Ba_{1-x}Sr_x)_2NaNb_5O_{15}$ where x is as in Table 1 below. For some samples, the materials were weighed to have the $MnO_2$ content as in Table 1. The thus-weighed materials were wet-milled in a ball mill for about 4 hours, and the resulting mixture was dried and then calcined at 700 to 900° C.

Each of the thus-dried mixture was roughly ground and a suitable amount of an organic binder added. Then, this was ground still wet for about 4 hours, using a ball mill, and thereafter sieved through a 40-mesh sieve.

Next, each of the thus-sieved samples was press-shaped under a pressure of 1000 $kg/cm^2$ to obtain circular discs each having a diameter of 12 mm and a thickness of 1.2 mm. These discs were baked at a temperature falling between 1150 and 1350° C. in the usual manner to obtain sintered ceramic discs.

A silver paste was applied onto the both surfaces of those sintered ceramic discs and baked to form silver electrodes thereon in a conventional manner. Then, a direct-current voltage of from 5 to 15 kV/mm was applied to those discs for 30 to 120 minutes in an insulating oil at 100 to 200° C. thereby polarizing the discs. Thus were finally obtained piezoelectric ceramic disc samples.

These samples were tested to obtain their relative dielectric constant (e), electromechanical coupling factor (Kt) of the vibration in the direction of the thickness, and piezoelectric constant ($d_{33}$). The data obtained are shown in Table

TABLE 1

| Sample No. | x | Amount of $MnO_2$ Added (wt. %) | Relative Dielectric Constant, e | Coupling Factor, Kt (%) | Piezoelectric Constant, $d_{33}$ (pC/N) |
| --- | --- | --- | --- | --- | --- |
| 1 | 0.0 | 0 | 174 | 10.2 | 13 |
| 2 | 0.25 | 0 | 394 | 10.7 | 17 |
| 3 | 0.5 | 0 | 779 | 11.4 | 33 |
| 4 | 0.75 | 0 | 1113 | 10.8 | 36 |
| 5 | 1.0 | 0 | 933 | 9.9 | 41 |
| 6 | 0.0 | 0.5 | 198 | 11.9 | 18 |
| 7 | 0.25 | 0.5 | 413 | 12.5 | 22 |
| 8 | 0.5 | 0.5 | 822 | 14.1 | 39 |
| 9 | 0.75 | 0.5 | 1177 | 13.2 | 42 |
| 10 | 1.0 | 0.5 | 1163 | 12.8 | 49 |
| 11 | 0.5 | 0.1 | 800 | 15.1 | 51 |
| 12 | 0.5 | 2.0 | 968 | 12.8 | 36 |
| 13 | 0.5 | 5.0 | 1052 | 12.3 | 22 |
| 14 | 0.5 | 6.0 | Non-polarized | | |

In Table 1, sample No. 6 to sample No. 13 are within the scope of the invention.

As seen in Table 1, sample Nos. 6 to 13 are all superior to sample Nos. 1 to 5 which are conventional ceramics of $(Ba_{1-x}Sr_x)_2NaNb_5O_{15}$ ($0 \leq x \leq 1$) in point of the electromechanical coupling factor (Kt) of the vibration in the direction of the thickness.

Sample No. 14 contained 6.0% by weight of $MnO_2$, which does not satisfy the requirement for the $MnO_2$ content of not larger than about 5% by weight. Sample No. 14 could not be polarized.

EXAMPLE 2

First prepared were starting materials of $BaCO_3$, $SrCO_3$, $Na_2CO_3$, $Nb_2O_5$, $MnCO_3$, $Cr_2O_3$, $WO_3$, $SiO_2$, $MoO_3$, NiO, $Co_2O_3$, $SnO_2$, MgO, $Sb_2O_3$, $TiO_2$, $ZrO_2$ and $Fe_2O_3$.

Next, these materials were weighed to give a component of $(1-y)(Ba_{1-x}Sr_x)Nb_2O_6$—$yNaNbO_3$ where x and y are as in Table 2 below. To specific samples, the side component shown in Table 2 was added. Next, these materials were processed in the same manner as in Example 1 to finally obtain piezoelectric ceramic disc samples.

These samples were tested to obtain their relative dielectric constant (e), electromechanical coupling factor (Kt) of the vibration in the direction of the thickness, and piezoelectric constant ($d_{33}$). The data obtained are shown in Table 2.

TABLE 2

| Sample No. | x | y | Amount of Side Component Added (wt. %) | Relative Dielectric Constant, e | Coupling Factor, Kt (%) | Piezoelectric Constant, $d_{33}$ (pC/N) |
| --- | --- | --- | --- | --- | --- | --- |
| 15 | 0.0 | 1/3 | Not added | 174 | 10.2 | 13 |
| 16 | 0.5 | 1/3 | Not added | 779 | 11.4 | 33 |
| 17 | 1.0 | 1/3 | Not added | 1103 | 9.9 | 36 |
| 18 | 0.0 | 0.3 | Not added | 166 | 13.7 | 22 |
| 19 | 0.5 | 0.3 | Not added | 533 | 15.6 | 43 |
| 20 | 1.0 | 0.3 | Not added | 998 | 12.3 | 41 |
| 21 | 0.0 | 0.2 | Not added | 154 | 14.4 | 25 |
| 22 | 0.3 | 0.2 | Not added | 316 | 17.7 | 31 |
| 23 | 0.5 | 0.2 | Not added | 502 | 21.0 | 45 |
| 24 | 0.7 | 0.2 | Not added | 991 | 18.1 | 46 |
| 25 | 1.0 | 0.2 | Not added | 964 | 16.7 | 46 |
| 26 | 0.0 | 0.2 | $MnO_2$/1.0 | 182 | 15.7 | 27 |
| 27 | 0.5 | 0.2 | $MnO_2$/1.0 | 763 | 25.1 | 51 |
| 28 | 0.5 | 0.2 | $MnO_2$/5.0 | 1063 | 23.0 | 47 |
| 29 | 0.5 | 0.2 | $MnO_2$/6.0 | Non-polarized | | |
| 30 | 1.0 | 0.2 | $MnO_2$/1.0 | 1091 | 19.7 | 49 |
| 31 | 0.0 | 0.2 | $Cr_2O_3$/1.0 | 177 | 15.4 | 25 |
| 32 | 0.5 | 0.2 | $Cr_2O_3$/1.0 | 781 | 21.3 | 46 |
| 33 | 1.0 | 0.2 | $Cr_2O_3$/1.0 | 1211 | 18.3 | 49 |
| 34 | 0.0 | 0.2 | $WO_3$/1.0 | 169 | 20.4 | 30 |
| 35 | 0.5 | 0.2 | $WO_3$/1.0 | 721 | 24.4 | 53 |
| 36 | 1.0 | 0.2 | $WO_3$/1.0 | 960 | 20.0 | 50 |
| 37 | 0.5 | 0.2 | $SiO_2$/1.0 | 692 | 19.8 | 49 |
| 38 | 0.5 | 0.2 | $MoO_3$/1.0 | 777 | 21.8 | 52 |
| 39 | 0.5 | 0.2 | NiO/1.0 | 602 | 18.8 | 37 |
| 40 | 0.5 | 0.2 | $Co_2O_3$/1.0 | 732 | 20.8 | 47 |
| 41 | 0.5 | 0.2 | $SnO_2$/1.0 | 741 | 24.8 | 51 |
| 42 | 0.5 | 0.2 | MgO/1.0 | 722 | 22.3 | 46 |
| 43 | 0.5 | 0.2 | $Sb_2O_3$/1.0 | 792 | 21.9 | 49 |
| 44 | 0.5 | 0.2 | $TiO_2$/1.0 | 724 | 21.1 | 48 |
| 45 | 0.5 | 0.2 | $ZrO_2$/1.0 | 836 | 20.2 | 50 |
| 46 | 0.5 | 0.2 | $Fe_2O_3$/1.0 | 803 | 21.8 | 50 |
| 47 | 0.0 | 0.15 | Not added | 116 | 13.3 | 17 |
| 48 | 0.5 | 0.15 | Not added | 524 | 14.2 | 37 |
| 49 | 1.0 | 0.15 | Not added | 1020 | 12.1 | 38 |
| 50 | 0.0 | 0.1 | Not added | Non-polarized | | |
| 51 | 0.5 | 0.1 | Not added | Non-polarized | | |
| 52 | 1.0 | 0.1 | Not added | Non-polarized | | |

In Table 2, sample No. 18 to sample No. 29 and sample No. 30 to sample No. 49 are within the scope of the invention.

As shown in Table 2, sample Nos. 18 to 28 and Nos. 30 to 49 are all superior to sample Nos. 1 to 5 in Table 1, which are conventional ceramics of $(Ba_{1-x}Sr_x)_2NaNb_5O_{15}$ ($0 \leq x \leq 1$), in point of the electromechanical coupling factor (Kt) of the vibration in the direction of the thickness.

In particular, sample Nos. 26 to 28 and Nos. 30 to 46, which contain, as the side component, any of $MnO_2$, $Cr_2O_3$, $WO_3$, $SiO_2$, $MoO_3$, NiO, $Co_2O_3$, $SnO_2$, MgO, $Sb_2O_3$, $TiO_2$, $ZrO_2$ and $Fe_2O_3$ in an amount not larger than about 5% by weight, are especially good in point of the electromechanical coupling factor (Kt).

It has been confirmed that the side component may be comprised of two or more of those oxides so far as its total amount is defined to be not larger than about 5% by weight. Preferably the amount is less that 2%.

Sample No. 29 contains, as the side component, $MnO_2$ in an amount of 6.0% by weight. Sample No. 29 could not be polarized under the condition employed herein. From this, it is understood that the amount of the side component, if added, is desirably not larger than about 5% by weight for attaining easy polarization of the piezoelectric ceramic composition.

Sample Nos. 15 to 17 and Nos. 50 to 52 in Table 2 are outside the scope of the invention. In sample Nos. 15 to 17, y=⅓. In other words, these samples do not satisfy the requirement for y<⅓. These sample Nos. 15 to 17 do not have a satisfactory electromechanical coupling factor (Kt). In sample Nos. 50 to 52, y=0.1. In other words, these samples do not satisfy the requirement for y≧0.15. These sample Nos. 50 to 52 could not be polarized.

OTHER EXAMPLES

The piezoelectric ceramic composition of the invention is not limited to the embodiments of Examples 1 and 2, but can be variously modified without overstepping the scope of the invention.

As has been mentioned hereinabove and is obvious from the data in Examples 1 and 2, the invention has improved the piezoelectric characteristics of the conventional ceramics of $(Ba_{1-x}Sr_x)_2NaNb_5O_{15}$ where $0 \leq x \leq 1$, and has provided a novel piezoelectric ceramic composition which does not contain lead and which can be used practically as a material for piezoelectric ceramic devices such as piezoelectric ceramic filters, piezoelectric ceramic oscillators, etc.

In particular, where the piezoelectric ceramic composition of the invention which comprises, as the essential component, a ceramic component represented by the general formula, (a) $(Ba_{1-x}Sr_x)Nb_2O_6$—(b)$NaNbO_3$ (where $0 \leq x \leq 1$) and contains, as the side component, at least one oxides of Mn, Cr, W, Si, Mo, Ni, Co, Sn, Mg, Sb, Ti, Zr and Fe, in a total amount of not larger than about 5% by weight in terms of $MnO_2$, $Cr_2O_3$, $WO_3$, $SiO_2$, $MoO_3$, $NiO$, $Co_2O_3$, $SnO_2$, $MgO$, $Sb_2O_3$, $TiO_2$, $ZrO_2$ and $Fe_2O_3$, respectively, and either $a=(1-y)$ and $b=y$ where $0.15 \leq y \leq \frac{1}{3}$ or $a=2$ and $b=1$ and Mn oxide is present, the piezoelectric characteristics are improved.

While the invention has been described in detail and with reference to specific embodiments thereof, it will be apparent to one skilled in the art that various changes and modifications can be made therein without departing from the spirit and scope thereof.

What is claimed is:

1. A piezoelectric ceramic composition comprising a main component represented by the general formula, (a) $(Ba_{1-x}Sr_x)Nb_2O_6$—(b)$NaNbO_3$ where $0 \leq x \leq 1$ and either (A) a is 1-y and b is y and $0.15 \leq y < \frac{1}{3}$ or (B) a is 2 and b is 1 and present is an oxide of Mn in an amount of not larger than about 5% by weight in terms of $MnO_2$.

2. A piezoelectric ceramic composition comprising a main component represented by the general formula, (1-y) $(Ba_{1-x}Sr_x)Nb_2O_6$—$yNaNbO_3$ where $0 \leq x \leq 1$ and $0.15 \leq y < \frac{1}{3}$.

3. The piezoelectric ceramic composition according to claim 2, wherein x is about 0.25–0.75 and y is about 0.2–0.3.

4. The piezoelectric ceramic composition according to claim 3 further comprising at least one member selected from the group consisting of the oxides of Mn, Cr, W, Si, Mo, Ni, Co, Sn, Mg, Sb, Ti, Zr and Fe, in a total amount of not larger than about 5% by weight in terms of $MnO_2$, $Cr_2O_3$, $WO_3$, $SiO_2$, $MoO_3$, $NiO$, $Co_2O_3$, $SnO_2$, $MgO$, $Sb_2O_3$, $TiO_2$, $ZrO_2$ and $Fe_2O_3$, respectively.

5. The piezoelectric ceramic composition according to claim 4 in which the amount of said oxide is less than 2% by weight.

6. The piezoelectric ceramic composition according to claim 2 further comprising at least one member selected from the group consisting of the oxides of Mn, Cr, W, Si, Mo, Ni, Co, Sn, Mg, Sb, Ti, Zr and Fe, in a total amount of not larger than about 5% by weight in terms of $MnO_2$, $Cr_2O_3$, $WO_3$, $SiO_2$, $MoO_3$, $NiO$, $Co_2O_3$, $SnO_2$, $MgO$, $Sb_2O_3$, $TiO_2$, $ZrO_2$ and $Fe_2O_3$, respectively.

7. The piezoelectric ceramic composition according to claim 6 in which the amount of said oxide is less than 2% by weight.

8. A piezoelectric ceramic composition comprising a ceramic component represented by the general formula $(Ba_{1-x}Sr_x)_2NaNb_5O_{15}$ where $0 \leq x \leq 1$, and containing an oxide of Mn in an amount of not larger than about 5% by weight in terms of $MnO_2$.

9. The piezoelectric ceramic composition according to claim 8 in which the amount of said oxide is less than 2% by weight.

10. The piezoelectric ceramic composition according to claim 6, wherein x is about 0.25–0.75.

11. The piezoelectric ceramic composition according to claim 10 in which the amount of said oxide is less than 2% by weight.

12. A polarized piezoelectric ceramic composition according to claim 10.

13. A polarized piezoelectric ceramic composition according to claim 8.

14. A polarized piezoelectric ceramic composition according to claim 6.

15. A polarized piezoelectric ceramic composition according to claim 4.

16. A polarized piezoelectric ceramic composition according to claim 3.

17. A polarized piezoelectric ceramic composition according to claim 2.

18. A polarized piezoelectric ceramic composition according to claim 1.

* * * * *